(12) United States Patent
Nozieres et al.

(10) Patent No.: US 7,957,181 B2
(45) Date of Patent: Jun. 7, 2011

(54) MAGNETIC TUNNEL JUNCTION MAGNETIC MEMORY

(75) Inventors: Jean-Pierre Nozieres, Le Sappey En Chartreuse (FR); Ricardo Sousa, Grenoble (FR); Bernard Dieny, Lans En Vercors (FR); Olivier Redon, Seyssinet-Pariset (FR); Ioan Lucian Prejbeanu, Sassenage (FR)

(73) Assignee: Commissariat a l'Energie Atomique, Paris (FR)

( * ) Notice: Subject to any disclaimer, the term of this patent is extended or adjusted under 35 U.S.C. 154(b) by 689 days.

(21) Appl. No.: 12/059,869

(22) Filed: Mar. 31, 2008

(65) Prior Publication Data

US 2008/0247072 A1  Oct. 9, 2008

Related U.S. Application Data

(60) Provisional application No. 60/942,615, filed on Jun. 7, 2007.

(30) Foreign Application Priority Data

Mar. 29, 2007  (FR) ...................................... 0754113

(51) Int. Cl.
*G11C 11/14* (2006.01)
(52) U.S. Cl. ..... 365/171; 365/148; 365/158; 365/225.5; 365/243.5; 977/933; 977/935
(58) Field of Classification Search ............... 365/48, 365/55, 62, 66, 74, 78, 80–93, 100, 130, 365/131, 148, 158, 171–173, 209, 213, 225.5, 230.07, 232, 243.5; 216/22; 257/421, E21.665; 438/3; 428/810–816, 817–825.1, 826; 977/933–935
See application file for complete search history.

(56) References Cited

U.S. PATENT DOCUMENTS

| 7,009,877 B1 | 3/2006 | Huai et al. |
| 2005/0018475 A1 | 1/2005 | Tran et al. |
| 2005/0116308 A1 | 6/2005 | Bangert |
| 2006/0154381 A1 | 7/2006 | Gaidis et al. |
| 2007/0002504 A1 | 1/2007 | Huai et al. |
| 2007/0097730 A1* | 5/2007 | Chen et al. .................... 365/158 |
| 2007/0268737 A1* | 11/2007 | Hidaka .......................... 365/148 |
| 2007/0297223 A1* | 12/2007 | Chen et al. .................... 365/173 |

* cited by examiner

*Primary Examiner* — Richard Elms
*Assistant Examiner* — Harry W Byrne
(74) *Attorney, Agent, or Firm* — Burr & Brown (57) ABSTRACT

This magnetic memory with a thermally-assisted write, every storage cell of which consists of at least one magnetic tunnel junction, said tunnel junction comprising at least:
one magnetic reference layer, the magnetization of which is always oriented in the same direction at the time of the read of the storage cell;
one so-called "free" magnetic storage layer, the magnetization direction of which is variable;
one insulating layer sandwiched between the reference layer and the storage layer.
The magnetization direction of the reference layer is polarized in a direction that is substantially always the same at the time of a read due to magnetostatic interaction with another fixed-magnetization layer called the "polarizing layer".

34 Claims, 8 Drawing Sheets

MAGNETIC TUNNEL JUNCTION MAGNETIC MEMORY

SUMMARY OF THE INVENTION

The present invention relates to the field of magnetic memories, especially non-volatile random-access magnetic memories used to store and read data in electronic systems. More particularly, it relates to Magnetic Random Access Memories, referred to as M-RAM, based on magnetic tunnel junctions.

DESCRIPTION OF THE PRIOR ART

There has been renewed interest in M-RAM memories due to the development of Magnetic Tunnel Junctions (MTJs) which have high magnetoresistance at ambient temperature. These random-access magnetic memories have many significant advantages: speed comparable to that of SRAM (read and write operations last a few nanoseconds),
  comparable density to that of DRAM
  non volatile like FLASH memory,
  no read/write fatigue,
  unaffected by ionizing radiation.

This being so, they are increasingly replacing memory that uses more conventional technology based on the charge state of a capacitor (DRAM, SRAM, FLASH) and becoming a universal memory.

In the first magnetic memories that were produced, the storage cell consisted of an element having so-called "giant magnetoresistance" consisting of a stack of several alternatively magnetic and non-magnetic metallic layers. A detailed description of this type of structure can be found, for example, in Documents U.S. Pat. No. 4,949,039 and U.S. Pat. No. 5,159,513 which deal with the basic structure and in Document U.S. Pat. No. 5,343,422 which deals with implementation of a random-access memory (RAM) based on these basic structures.

Because of its architecture, this technology makes it possible to produce non-volatile memories using technology that is simple but which has a limited capacity. The fact that the storage cells are connected in series along each line limits possible integration because the signal becomes weaker and weaker as the number of cells increases.

The development of Magnetic Tunnel Junction (MTJ) storage cells has made it possible to achieve significant improvement in the performance and method of functioning of these memories. Such magnetic tunnel junction magnetic memories are described, for instance, in Document U.S. Pat. No. 5,640,343. In their simplest forms, they comprise two magnetic layers of different coercivity separated by a thin insulating layer.

These magnetic tunnel junction MRAMs have been the subject of enhancements such as those described, for example, in Document U.S. Pat. No. 6,021,065 and in the "Journal of Applied Physics"—Vol. 81, 1997, page 3758, and shown in FIG. 1. As is apparent, every storage cell (10) consists of a combination of a CMOS transistor (12) and a MTJ (11). Said tunnel junction (11) comprises at least one magnetic layer (20) referred to as the "storage layer", a thin insulating layer (21) and a magnetic layer (22) referred to as the "reference layer".

Figure 1:
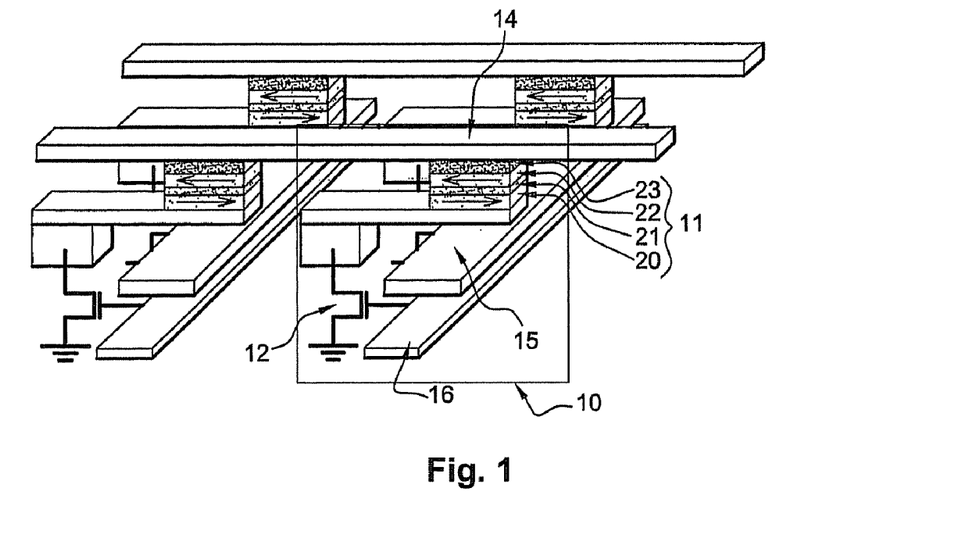
FIG. 1, as described, is a schematic view of the architecture of a magnetic memory according to the prior art, the storage cells of which comprise a magnetic tunnel junction.

Preferably, but not limitatively, the two magnetic layers are made based on 3d metals (Fe, Co, Ni) and alloys thereof and the insulating layer conventionally consists of alumina ($Al_2O_3$). Preferably, magnetic layer (22) is coupled to an antiferromagnetic layer (23), the function of which is to pin layer (22) so that its magnetization does not flip or flips reversibly when subjected to an external magnetic field. Preferably, reference layer (22) can itself consist of several layers as described, for instance, in Document U.S. Pat. No. 5,583,725 in order to form a synthetic antiferromagnetic layer.

It is also possible to replace the single tunnel junction by a double tunnel junction as described in the paper by Y. Saito et al., Journal of Magnetism and Magnetic Materials Vol. 223 (2001) page 293. In this case, the storage layer is sandwiched between two thin insulating layers with two reference layers located on the side opposite to said thin insulating layers When the magnetizations of the magnetic storage and reference layers are anti-parallel, the resistance of the junction is high. In contrast, when the magnetizations are parallel, this resistance becomes low. The relative variation of resistance between these two states can attain 40% through an appropriate choice of materials for the layers in the stack and/or thermal treatments of said materials.

Thus, as stated earlier, junction (11) is placed between a switching transistor (12) and a current supply line (14) (word line) forming an upper conductive line. An electric current flowing in the line produces a first magnetic field. A lower conductive line (15) (bit line), generally arranged at right angles relative to line (14) (word line), makes it possible to produce a second magnetic field when an electric current is passed through it.

In write mode, transistor (12) is blocked and therefore no current flows through the transistor. Current pulses are passed through current line (14) and line (15). Junction (11) is therefore subjected to two orthogonal magnetic fields. One field is applied along the axis of difficult magnetization of the storage layer, also referred to as the "free layer" (22) in order to reduce its reversal field, whereas the other field is applied along its axis of easy magnetization in order to provoke reversal of the magnetization and thus writing of the storage cell.

In read mode, transistor (12) is placed in saturated regime, i.e. the current crossing this transistor is maximum, by sending a positive current impulse in the gate of said transistor. The current sent in line (14) only crosses the storage cell in which the transistor is placed in saturated mode. This current makes it possible to measure the resistance of the junction of this storage cell. In relation to a reference storage cell, one then knows if the magnetization of the storage layer (22) is parallel or anti-parallel to that of the reference layer (20). The state of the storage cell in question ("0" or "1") may thus be determined.

The magnetic field pulses generated by the two lines (14, 15) make it possible to switch the magnetization of storage layer (20) during the write process. These magnetic field pulses are produced by sending brief (typically 2 to 5 ns) low-intensity (typically less than 10 mA) current pulses along current lines (14, 15). The intensity of these pulses and their synchronization are adjusted so that only the magnetization of the storage cell located at the point where these two current lines intersect (selected point) can switch due to the effect of the magnetic field generated by the two conductors. The other storage cells located on the same row or same column (half-selected elements) are in fact only subjected to the magnetic field of one of the conductors (14, 15) and consequently do not reverse.

Given the nature of the mechanism for writing the storage cells, the limits of this architecture are clearly apparent.

Because writing is obtained using an external magnetic field, writing is subject to the value of the individual reversal field of each storage cell. If the distribution function of the reversal fields for all the storage cells is wide (in fact it is not uniform because of fabrication constraints and inherent statistical fluctuations), the magnetic field at the selected storage cell must exceed the highest reversal field in the statistical distribution with the risk of inadvertently reversing certain storage cells, located on the corresponding row or column, if their reversal field is in the lower part of the distribution and weaker than the magnetic field generated by the row or column alone. Conversely, if one wants to make sure that no storage cell can be written by one row or column alone, the write current must be limited so that it never exceeds, for these storage cells, the magnetic field that corresponds to the lower part of the distribution with the risk of not writing the selected storage cell at the intersection of said row and column if its reversal field is in the upper part of the distribution.

In other words, this architecture with selection by magnetic field using rows and columns or conductors can easily result in write addressing errors. Given the fact that the distribution function of the reversal fields of the storage cells can be expected to become wider as their size reduces because it is the geometry of the storage cells (shape, irregularity, defect) that dominates the mechanism for reversing the magnetization, this effect is bound to become worse in future-generation products.

Another drawback of these prior-art memories is the stability of the magnetization of the storage layer with respect to thermal fluctuations as the size of the storage cell decreases. In fact, the energy barrier that must be overcome in order to switch the magnetization of this layer from one orientation to another is proportional to the volume of this layer. As this volume reduces, the height of the barrier then becomes comparable to thermal agitation $k_B T$ where $k_B$ is Boltzman's constant. Information written in the memory is then no longer preserved. In order to mitigate the consequences of this problem, one is forced to increase the magnetic anisotropy of the storage layer by choosing a more anisotropic material or by accentuating the shape anisotropy of the storage cell, for example if it has an ellipsoidal shape, by increasing its aspect ratio. But doing this increases the field that is required in order to obtain magnetic switching and hence also increases the power consumed in order to generate the field required to obtain magnetic switching. The current in the word and bit lines may even, at a certain stage, exceed the limiting threshold imposed by electromigration in these conductive lines (typically of the order of $2 \cdot 10^7$ A/cm$^2$).

According to an enhancement described, for example, in U.S. Pat. No. 6,385,082, a current pulse is sent through the storage cell during the write process by opening transistor (12) in order to induce significant heating of said storage cell. Increasing the temperature of the storage cell produces a reduction in the magnetic write field required. During this phase when the temperature of the addressed cell is significantly higher than that of the other storage cells, current pulses are sent in lines (14, 15) in order to create two orthogonal magnetic fields that make it possible to switch the magnetization of the storage layer of the junction in question. This thermally-assisted write operation makes it possible to improve write selection because only the selected storage cell is heated and the other half-selected storage cells on the same row or the same column remain at ambient temperature. In other words, the enhancement described in this document aims to increase write selectivity by raising the temperature of the addressed junction whilst retaining the basic concept of writing by sending two orthogonal magnetic-field pulses.

Other addressing methods, also based on raising the temperature of the storage cell, but using a single magnetic field or magnetic switching by injection of spin-polarized current into the storage layer are described in Documents FR 2 829 867 and FR 2 829 868.

The use of such heating of the selected storage cell has many advantages, including the following:
    considerable improvement in write selectivity because only the storage cell that is to be written is heated;
    considerable improvement in write selectivity by using materials with a high write field at ambient temperature;
    improvement in stability in a zero magnetic field (retention) by using materials with high magnetic anisotropy (intrinsic or due to shape of storage cell) at ambient temperature;
    possibility of significantly reducing the size of the storage cell without affecting its stability limit by using materials with high magnetic anisotropy at ambient temperature;
    reduced power consumption at the time of a write;
    possibility of obtaining multi-level storage under certain circumstances.

Preferably, the storage layer may, like the reference layer, be coupled to an adjacent antiferromagnetic layer whereof the blocking temperature Tb1 is lower than that (Tb2) which pins the magnetization of the reference layer. Thus, at the time of a write, the current pulse that flows through the tunnel junction raises the temperature of the storage layer to a temperature slightly above Tb1 so that the magnetization of the storage layer can be switched by means of the applied moderate field without affecting the magnetization of the reference layer. The device's operating temperature range is thus limited by the difference between Tb1 and Tb2. This being so, if the heating current pulse produces a temperature increase ΔT and the standby temperature, i.e. other than during the write phase, is Ts (typically 40° C. above ambient temperature), the following two conditions must be satisfied:

$$Ts<Tb1<Tb2$$

and $$Tb1<Ts+\Delta T<Tb2$$

In other words, standby temperature Ts must fluctuate less than the difference Tb2–Tb1, typically 100° C. In practice, most antiferromagnetic layers do not have a well-defined blocking temperature but rather a statistically distributed blocking temperature that may extend over 100° C. or even 200° C. In fact, when the magnetic tunnel junction is heated slightly above Tb1 it is possible that certain grains in the antiferromagnetic reference layer (especially those in the low temperature distribution part of the blocking temperature distribution) may start to switch well below the blocking temperature (Tb2) of the reference layer as a whole. This results in partial depolarization of the magnetization of the reference layer which may lead to gradual reduction in the magnetoresistance signal of the tunnel junction and, ultimately, read errors.

Consequently, for the reference layer, it seems desirable to avoid pinning the magnetization of this layer by coupling with an antiferromagnetic layer in order to avoid these gradual depolarization problems due to blocking-temperature distribution, thus increasing the thermal operating window.

The object of the invention is to achieve this objective by using a different mechanism for fixing the orientation of the magnetization of the reference layer during a read. This actually involves inducing magnetostatic interaction of said reference layer with a fixed-magnetization magnetic layer and, generally speaking, with a fixed-magnetization magnetic element.

In other words, the invention aims to ensure that the magnetization of the reference layer is in a fixed direction at the time of a read, not because it is permanently pinned in a fixed direction by coupling with an adjacent antiferromagnetic layer as in the prior art, but because it is oriented or re-orientated in a direction that is always the same at the time of a read due to magnetostatic interaction with another fixed-magnetization magnetic element. This fixed-magnetization element is subjected to temperature variations less than those to which the reference layer is subjected at the time of a read and, above all, a write.

SUMMARY OF THE INVENTION

In order to achieve this result, the present invention pertains to a magnetic memory with a thermally-assisted write, every storage cell of which consists of at least one magnetic tunnel junction, said tunnel junction comprising at least:
- one so-called magnetic "reference" layer, the magnetization of which is always substantially in the same direction at the time of a read;
- one so-called "free" magnetic storage layer, the magnetization direction of which is variable;
- one insulating layer sandwiched between the reference layer and the storage layer.

According to the invention, the magnetization direction of the reference layer is always oriented substantially in the same direction at the time of a read due to magnetostatic interaction with another fixed-magnetization layer called the "polarizing layer". The magnetization of this polarizing layer is pinned in a fixed direction and it is the magnetostatic field radiated by this pinned magnetization which always orientates the magnetization of the soft layer substantially in the same direction at the time of a read.

Preferably, this polarizing layer and the reference layer with which it interacts magnetostatically are sufficiently close to favor such interaction. For the same reason, the reference and polarizing layers are, as far as possible, in a closed magnetic flux configuration which ensures good magnetostatic coupling of their magnetizations.

According to the invention, this polarizing layer is arranged so that it is subjected, during read phases but above all during write phases, to thermal variations that are less than those to which the reference layer with which it interacts magnetostatically is subjected.

To achieve this, it is advantageous to insert a thin layer of low thermal conductivity between these two magnetostatically interacting layers in order to limit the thermal variations of the polarizing layer during read and above all write phases, preferably above or below the stack that constitutes the tunnel junction.

The stack that constitutes the tunnel junction is formed by a storage layer (which may consist of a ferromagnetic layer pinned by an antiferromagnetic layer but also of a layer, the coercivity of which decreases sharply at the write temperature), a ferromagnetic reference layer and an insulating barrier made of alumina ($Al_2O_3$), $TiO_2$ or MgO of small thickness (<2 nm) which separates the storage and reference layers. This layer with low thermal conductivity is generally located so that one of its faces is in contact with the tunnel junction and its other face is in contact with one of the magnetostatically interacting layers. Nevertheless, inserting one or more other layers between them would not extend beyond the scope of the invention as long as magnetostatic interaction between the reference layer and the polarizing layer is maintained.

The magnetization of the actual polarizing layer may be pinned by association with a layer made of an antiferromagnetic material.

The layer of low thermal conductivity located between the reference layer and the polarizing layer is advantageously made of GeSbTe or BiTe.

According to the invention, the storage layer comprises a bilayer that associates a layer made of a ferromagnetic material with planar magnetization, typically selected from the group comprising Permalloy ($Ni_{80}Fe_{20}$), $Co_{90}Fe_{10}$ or other magnetic alloys containing Fe, Co or Ni, and an antiferromagnetic layer with a moderate blocking temperature, typically, but not limitatively, from 120 to 220° C. and typically consisting of $Ir_{20}Mn_{80}$, the selected thickness of these two layers being 1 to 4 nm for the former and 4 to 8 nm for the latter respectively.

According to the invention, the insulating layer referred to in the general definition of the magnetic storage cell is selected from the group comprising alumina ($Al_2O_3$), $TiO_2$ and MgO, this insulating layer having a low Resistance times Area product (RA) typically from 1 to 500 ohms·µm².

According to one aspect of the invention, a layer of low thermal conductivity, typically selected from BiTe and GeSbTe, is interposed between the antiferromagnetic layer that pins the storage layer and a conductive metallic layer on the face opposite the tunnel junction. This layer of low thermal conductivity is itself in contact with or separated by a thin protective layer of a conductive metallic layer typically made of copper (Cu) or tantalum (Ta).

According to one version of the invention, the reference layer is polarized by means of a polarizing layer inserted in the line which ensures electrical connection to the storage cell.

According to the invention, the polarizing layer may comprise a bilayer associating firstly a layer made of a ferromagnetic material, typically a $Co_{1-x}Fe_x$ alloy, x being 0 to 0.5, and secondly an antiferromagnetic layer having a high blocking temperature. The antiferromagnetic layer which fixes the magnetization direction of the polarizing layer can be made of PtMn or IrMn.

The storage cell can be written as a result of using a so-called magnetic "write" field generated by passing an electric current through a current line located close to the storage cell. Writing said storage cell may also be the result of spin polarizing the current which flows through the tunnel junction. If a magnetic write field is used, it is used in order to reinforce the magnetization direction of the reference layer.

In another embodiment of the invention, the reference layer is polarized by means of permanent magnets positioned on either side of the storage cell and, advantageously, at the level of the reference layer. These permanent magnets consist of layers of strongly magnetic ferromagnetic materials with a high coercive field such as materials selected from the group comprising SmCo, CoPt, CoCrPt or FePt. Alternatively, these magnets may consist of strongly magnetic ferromagnetic materials such as those, for example, made of a CoFe alloy and pinned by an antiferromagnetic layer with a high blocking temperature in excess of 200° C. in particular.

In another embodiment of the invention, the reference layer is polarized by means of a permanent polarizing magnet located above the memory, the latter being assumed to contain several storage cells.

According to the invention, the reference layer and the polarizing layer may respectively consist of a number of ferromagnetic layers which are antiferromagnetically coupled through a non-magnetic spacer, especially one made of ruthenium.

In yet another embodiment of the invention, a laminated reference layer consisting of a first laminated polarizing layer which is pinned by a PtMn type antiferromagnetic layer is used as a reference layer. The second laminated layer is polarized by an additional dual effect: firstly by the magnetostatic field radiated by the first laminated layer onto the second and also by antiferromagnetic coupling through a ruthenium (Ru) spacer.

In this configuration, the polarizing layer itself is advantageously laminated and pinned by an antiferromagnetic layer, especially one made of PtMn, with the laminated reference layer being polarized by said polarizing layer by antiferromagnetic coupling through a spacer made of ruthenium, this coupling being added to the magnetostatic coupling between these layers.

Also in this configuration, the reference layer is advantageously in contact with the tunnel barrier of the magnetic tunnel junction, with the last constituent layer of the laminated reference layer which is in contact with said tunnel barrier being likely to be made of a ferromagnetic material selected from the group comprising CoFe and CoFeB.

Advantageously, the number of stacks coupled in antiparallel by one Ru layer and consisting of the laminated reference layer/laminated polarizing layer assembly is greater than two, with the stack farthest from the tunnel barrier being pinned by interaction with a layer made of an antiferromagnetic material.

Advantageously, the ferromagnetic layers that are in immediate contact with the tunnel barrier of the magnetic tunnel junction and the Ru layer are thicker than those within the laminated layers.

BRIEF DESCRIPTION OF THE DRAWINGS

The way in which the invention can be implemented and its resulting advantages will be made more readily understandable by the descriptions of the following embodiments, given merely by way of example, reference being made to the accompanying drawings.

DESCRIPTION OF THE PREFERRED EMBODIMENTS

Figure 2:
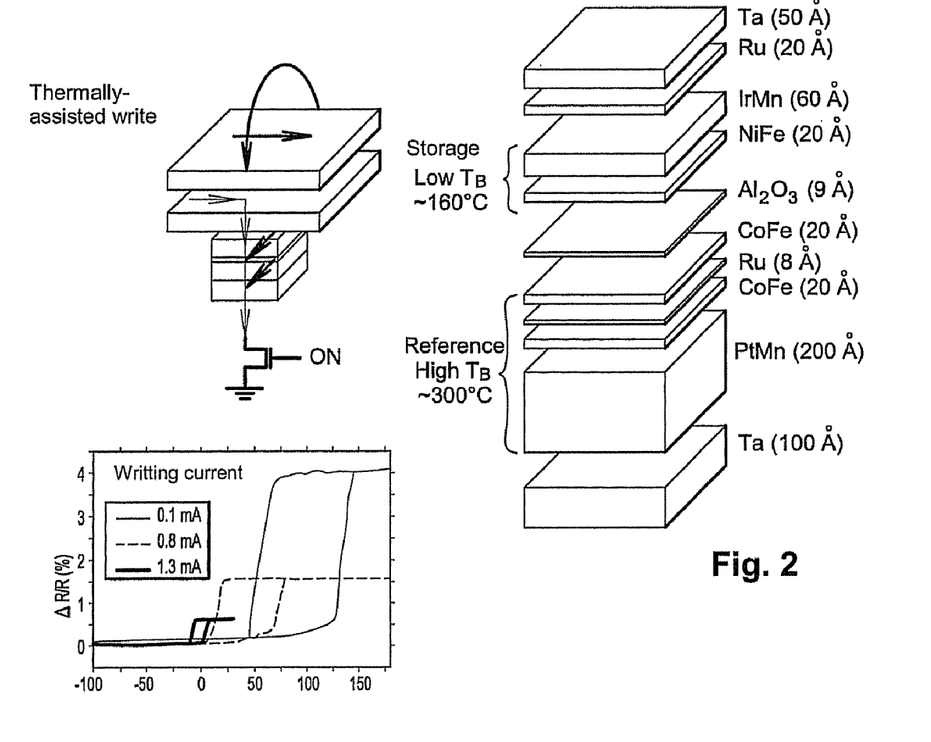
FIG. 2 is a schematic view of the write principle of the storage cell in FIG. 1, thermally assisted, said storage cell also being shown alongside a graph that shows the gradual decrease in pinning of the storage layer as the heating current flowing through the tunnel junction increases.

FIG. 2 shows a diagram illustrating the operating principle of a thermally-assisted write to an MRAM cell. The combination of a temperature increase caused by a current pulse through the junction and applying a moderate magnetic field created by a current pulse in the bit line is shown in the top left-hand part of the graph in this Figure.

The right-hand part of FIG. 2 shows a preferred prior-art embodiment in the context of such operation. It can be seen that the two reference and storage layers are pinned by interaction with an adjacent antiferromagnetic layer.

The bottom left-hand part of FIG. 2 shows a graph illustrating the gradual decrease in pinning of the storage layer as the heating current flowing through the tunnel junction increases and hence the limitations of such a structure.

The top left-hand part of said Figure schematically shows a combination of the temperature rise of the stack caused by a current pulse through the junction and a moderate magnetic field created by a current pulse in the bit line.

According to one essential aspect of the invention, the reference layer of the storage cell is associated with a polarizing element with which it interacts magnetostatically.

To achieve this, there are various feasible embodiments within the scope of the invention which are described below in greater detail.

Figure 3A:
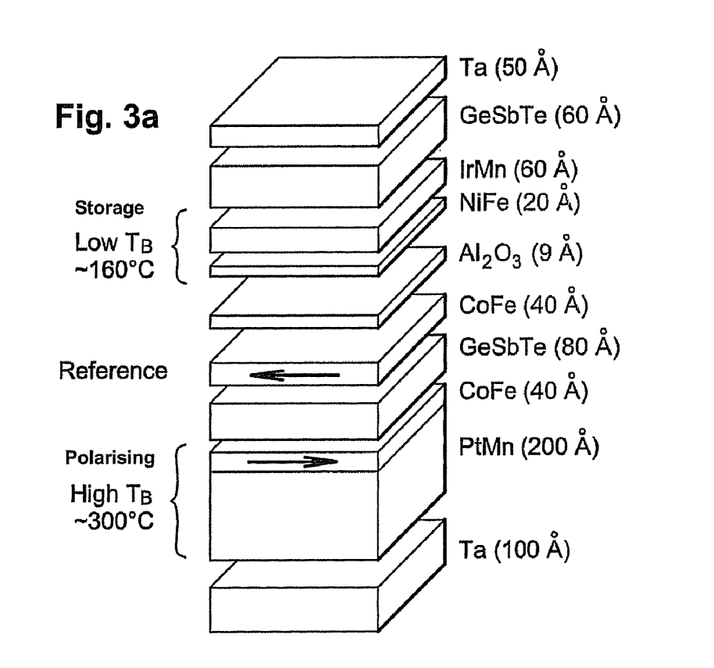
FIG. 3a is a schematic view of the structure of a storage cell in accordance with a first embodiment of the invention, with FIG. 3b showing variation in temperature versus position in the thickness of the structure.
Figure 3B:
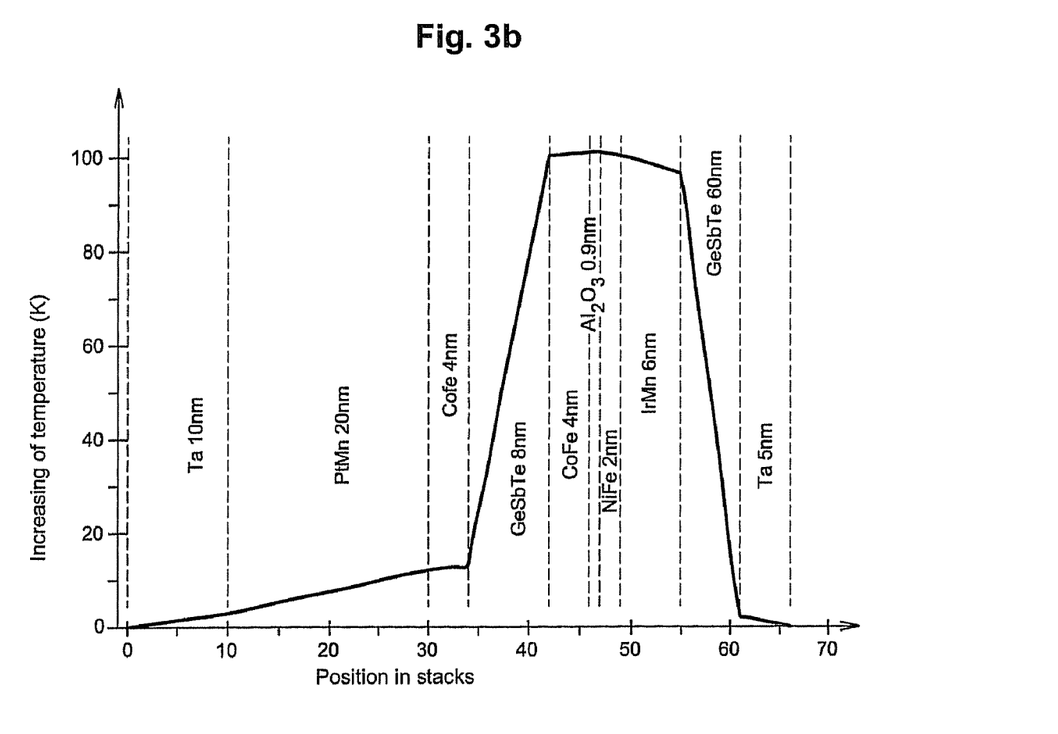

1. Storage Cell with Polarizing Layer Separated from the Tunnel Junction by a Thermal Barrier In a first embodiment described, more particularly, in relation to FIGS. 3 and 4, the stack of the storage cell comprises a tunnel junction with a single insulating barrier that separates the reference and storage layers.

The storage layer comprises a bilayer that associates a ferromagnetic material with planar magnetization (for example a Permalloy $Ni_{80}Fe_{20}$ layer having a thickness of the order 1 to 4 nm or a $Co_{90}Fe_{10}$ layer having a thickness of 1 to 4 nm) and an antiferromagnetic layer having a moderate blocking temperature, i.e. of the order of 120° C. to 220° C. This blocking temperature must be sufficiently high to ensure that, at standby temperature (not during a write), magnetization of the storage layer is sufficiently pinned to be able to preserve information over a period of several years but not so high as to make it necessary to heat the junction excessively for every write operation because this could cause materials to degrade and power consumption to rise. This antiferromagnetic layer typically consists of $Ir_{20}Mn_{80}$ having a thickness of the order of 4 to 6 nm.

Alternatively, the storage layer could be formed by a single magnetic layer having a coercive field that varies greatly between the operating temperature (no write operation) and the write temperature (typically from 120 to 220° C.).

The ferromagnetic storage layer is in contact with a tunnel barrier which has a low Resistance times Area product (RA). Because, generally speaking, tunnel junctions have limited voltage-handling capability because of electrical breakdown, it is necessary to reduce the product RA sufficiently in order to be able to pass a current through the tunnel barrier which is sufficiently strong to raise the temperature of the storage layer above its blocking temperature. Depending on the composition of the stacks used, the heating-current density required to raise the temperature of the junction by around 100° C. can vary from $10^5$ $A/cm^2$ to $10^7$ $A/cm^2$ depending whether or not thermal barriers are present and depending on the effectiveness of such barriers (determined by their thickness and their thermal conductivity). RA products of the order of 1 to 500 $\Omega \cdot \mu m^2$ are suitable for handling these current densities. Examples of materials for producing the tunnel barrier include alumina (thickness of the order of 7 to 12 Angstroms) or $TiO_2$ (thickness 10 to 20 Angstroms) or MgO (thickness 10 to 25 Angstroms).

A layer with very low thermal conductivity used as a thermal barrier is interposed on the face opposite the storage layer between the antiferromagnetic layer that pins the storage layer at standby temperature and the electrode which ensures electrical connection. The purpose of this layer is to increase the efficiency of heating by the current flowing through the junction whilst limiting the diffusion of heat towards the electrode which ensures electrical connection to the tunnel junction on the storage-layer side. This thermal barrier can be made of BiTe or GeSbTe and typically has a thickness of 2 to 10 nm. The thermal barrier itself is electrically connected to the electrode directly or via a conductive layer, for example one made of TiN or TiWN.

The so-called ferromagnetic "reference" layer is located on the opposite side of the tunnel barrier relative to the storage layer. The magnetization of the latter points in a fixed direction during a read. This layer can consist of an alloy of CoFe ($Co_{90}Fe_{10}$, $Co_{70}Fe_{30}$, $Co_{80}Fe_{10}B_{10}$), of NiFe ($Ni_{80}Fe_{20}$) or a 1 nm CoFe/2 nm NiFe bilayer, with the CoFe layer being located against the tunnel barrier in order to accentuate the spin polarization of tunnel electrons. The thickness of this layer is in the 1 to 4 nm range.

With the prior state of the art, the magnetization of this layer is, generally speaking, pinned by an antiferromagnetic layer or this layer is part of a pinned synthetic antiferromagnetic layer consisting of a stack of two ferromagnetic layers coupled in anti-parallel through an Ru layer, the second ferromagnetic layer itself being pinned to an antiferromagnetic layer (synthetic layer familiar to those skilled in the art).

In this invention and in contrast to the prior state of the art, the reference layer is not pinned by exchange anisotropy and is not part of a pinned synthetic antiferromagnetic layer. Here, the reference layer is in contact with or, preferably, separated, by a thin TiN or TiWN layer used as an anti-diffusion layer, from another thermal barrier of the same kind as that described earlier. The purpose of this second thermal barrier is also to limit the diffusion of heat towards the electrode located on the reference-layer side. On the other side of the tunnel barrier, there is a so-called "polarizing" ferromagnetic layer, the magnetization of which is pinned. This pinning can also be ensured by coupling with an adjacent antiferromagnetic layer, for example one made of PtMn having a thickness of 20 nm or of IrMn and thicker than 8 nm.

This layer can also consist of a layer with high coercivity (of the $Co_{80}Cr_{20}$ or SmCo permanent magnet type). This layer must have a magnetic moment approaching that of the reference layer so that these two layers with planar magnetization located one above the other are in a closed flux configuration (see FIG. 4), i.e. their magnetizations are magnetostatically coupled in anti-parallel and radiate practically no field at the level of the storage layer.

Because of this strong magnetostatic coupling, the magnetization of the reference layer is itself indirectly polarized by the pinned polarizing layer. The advantage of this approach compared with the prior state of the art lies in the thermal barrier between the reference layer and the pinned polarizing layer because the pinned polarizing layer is subjected to only slight variations in temperature at the time of every write operation. As a result, its quality of pinning is not likely to deteriorate over time. This layer preserves good polarization during operation of the device and therefore in turn ensures good polarization of the reference layer.

Summing up, the polarizing layer consisting of a ferromagnetic layer pinned by an antiferromagnetic layer is inserted into the stack with the tunnel junction. The polarizing ferromagnetic layer is only separated from the reference layer by a thermal barrier which makes it possible to minimize heating of the polarizing layer whilst being sufficiently close to the reference layer for the latter's magnetization to be maintained in anti-parallel alignment with the magnetization of the polarizing layer by magnetostatic coupling between these two layers.

FIG. 3b shows confinement of the increase in temperature between the two thermal barriers when a current flows through the storage cell thus constituted and, at the same time, the temperature of the polarizing layers which is less than 20% of the maximum temperature.

Figure 4:
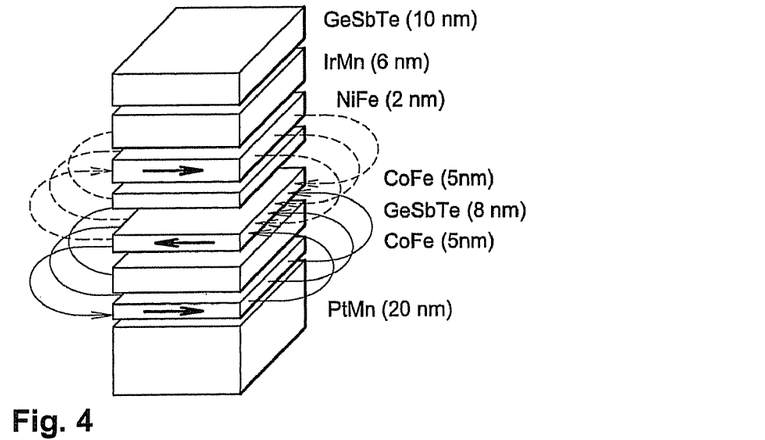
FIG. 4 shows closed flux between the pinned polarizing layer, which is distinctive of the invention, and the reference layer as well as the magnetic field radiated by the storage layer in the context of the embodiment of the invention described in relation to FIGS. 3a and 3b.

Above-mentioned FIG. 4 shows, as already stated, the closed flux between the pinned polarizing layer and the reference layer and also the field radiated by the storage layer.

The constraints that must be taken into consideration when producing such a structure are as follows:

It is preferable for the fields radiated by the polarizing layer and the reference layer to cancel each other out at the level of the storage layer. This can be achieved by dimensioning the reference and polarizing layers so that the magnetostatic fields radiated at the level of the storage layer have a similar magnitude and are of opposite sign. In this case, the effective field acting on the storage layer is virtually zero and in every case is substantially reduced relative to the field produced by each layer individually.

If there is a residual non-zero effective field acting on the storage layer, the currents needed in order to write the two directions of a storage cell are unbalanced but it still remains possible to write the bit. It is even possible to use this residual effective field to impose a direction on the storage layer and to use the field line to write only in the opposite direction. This has the advantage that the current source which produces the current sent in the field line in order to write can be a single-pole rather than bipolar source and this makes the source much more compact using CMOS technology.

The field radiated by the storage layer itself contributes to destabilization of the reference layer when the storage layer and the reference layer are magnetized in the same direction which is equivalent to a low-resistance state. To reduce this destabilizing field on the reference layer, it is possible to reduce the total magnetization of the storage layer by reducing the thickness of the layer and/or using a weakly magnetic material. Another possible way of reducing total magnetization is to produce a storage layer having a synthetic ferrimagnetic structure. With this synthetic ferrimagnetic structure, the effective magnetization of the storage layer is reduced by antiferromagnetic coupling between two ferromagnetic layers (FM) separated by a ruthenium (Ru) spacer typically having a thickness of 0.5 nm to 1 nm, for example: FM/Ru 0.7 nm/FM.

If the field radiated onto the storage layer by the polarizing and reference layers is not zero and sufficient to reverse the orientation of the storage layer, this structure can be used for unipolar writing but nevertheless has accompanying constraints in terms of power consumption.

Figure 7:
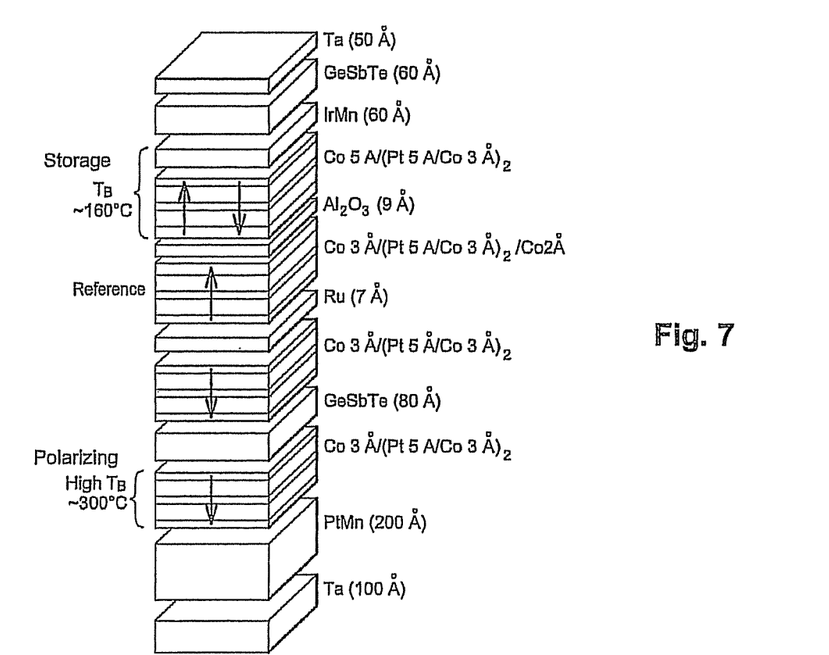
FIG. 7 is a schematic view of the structure of a storage cell in accordance with a fourth embodiment of the invention wherein the magnetization of the layers that constitute it is oriented outside the plane that bounds them.

One variation of this implementation using magnetic layers with out-of-plane magnetization is shown in FIG. 7. The layers with planar magnetization are replaced by cobalt-platinum (Co/Pt) multilayers. In this case the magnetization direction is perpendicular to the plane of the layers.

2. Storage Cell with Double Tunnel Barrier and a Polarizing Layer Separated by a Thermal Barrier In a second embodiment shown in FIG. 5, the stack consists of a double tunnel-junction structure.

Figure 5:
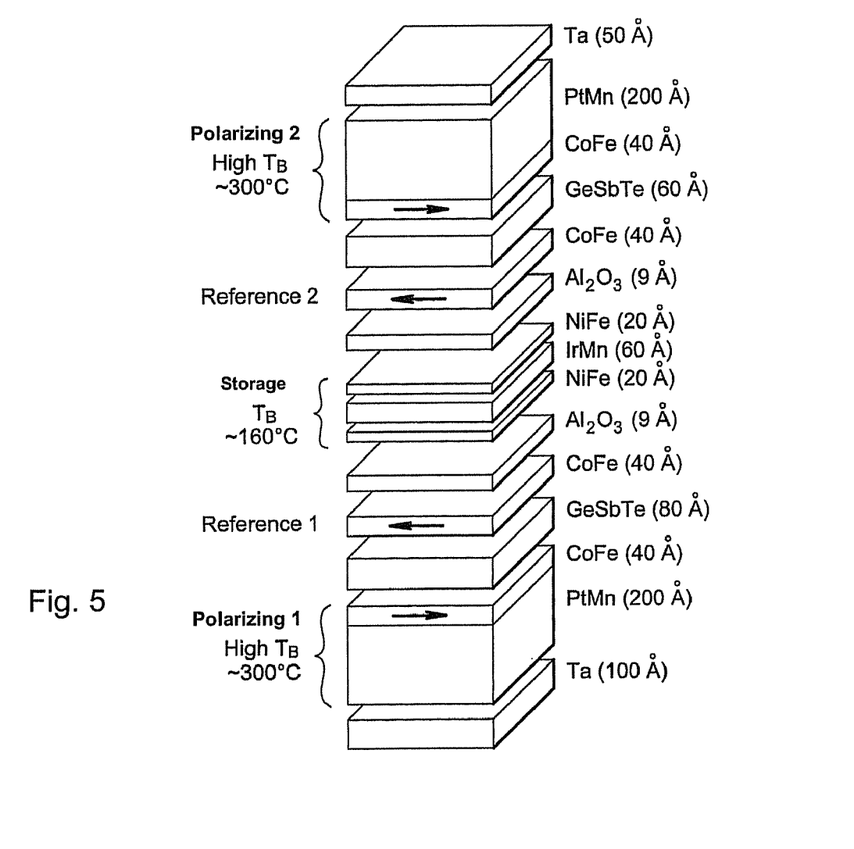
FIG. 5 is a schematic view of the structure of a storage cell in accordance with a second embodiment of the invention that uses two tunnel barriers.

The storage layer is inserted between the two tunnel barriers with each tunnel barrier having, on the side opposite the storage layer, a reference layer, the magnetization of which is maintained in a fixed direction at the time of a write by magnetostatic interaction with another pinned magnetization layer.

As in the previous embodiment, here the two reference layers are each separated from the two pinned layers by a thermal barrier, the purpose of which is to confine heat in the central part of the stack at the level where the storage layer is located. These thermal barriers also prevent the pinned layers from being subjected to excessively large temperature fluctuations, thereby avoiding gradual depolarization of their magnetization.

In this stack, the storage layer advantageously consists of a tri-layer of the CoFe 2 nm/IrMn 5 nm/CoFe 2 nm type comprising a central antiferromagnetic layer with a moderate blocking temperature (as previously, of the order of 160 to 220° C. made of IrMn or PtMn or PtPdMn) sandwiched between two ferromagnetic layers of soft materials that are in contact with the tunnel barriers. The thickness of these ferromagnetic layers is typically 1 to 5 nm. These ferromagnetic layers can be made of $Ni_{80}Fe_{20}$, $Co_{100-x}Fe_x$ where x is typically 0 to 30, $Co_{100-x-y}Fe_xB_y$, where x is typically 0 to 30 and y is typically 0 to 20.

As previously, the tunnel barriers can be made of alumina, $TiO_2$ or MgO with RA products typically of the order of 5 to 500 $\Omega \cdot \mu m^2$. In order to obtain the maximum heating effectiveness from this structure, it is important that the resistors of the two barriers are as close as possible. In fact, if the resistance times area product of one barrier is $RA_1$ and that of the second barrier is $RA_2$ and both junctions have comparable breakdown voltages Vmax, the maximum current density that can flow through the system will be jmax=Min ($Vmax/RA_1$, $Vmax/RA_2$). The maximum heating power per unit of surface area of the stack will then be of the order of $P/A=(RA_1+RA_2) \cdot jmax^2$. This quantity reaches its maximum value for a given $RA_1$ when $RA_2=RA_1$.

The thermal barriers, pinned layers and antiferromagnetic pinning layers typically consist of the same materials as in the previous embodiment. The pinned magnetic layers are in a closed-flux configuration with their corresponding reference layers located either side of the corresponding thermal barrier.

The sought-after objectives when dimensioning the storage layer, reference layer and polarizing layer are as follows:
  reduce or cancel the effective field at the level of the storage layer by compensating the magnetostatic fields radiated by the reference layers and polarizing layers (the effective field being the result of the vector sum of the fields radiated by the reference and polarizing layers and storage layer, including any orange-peel coupling between the storage layer and the reference layers);
  create a polarizing field due to the polarizing layer at the level of the upper reference layer higher in modulus than the field radiated by the storage layer at the level of the reference layer—the difference between these two fields must be sufficiently large to allow the magnetization of the reference layer to be maintained parallel to the polarizing field, regardless of the orientation of the magnetization of the storage layer;
  the magnetic field generated by the write line can also be used to accentuate alignment of the reference layer in the desired direction. This implies that, when a word is written, the storage cells along a field line are written in a first direction and during a second stage with a field that stabilizes the desired direction opposite the initial field for the reference layer.

The fields radiated by the polarizing and reference layers have opposite directions at the level of the storage layer. The dimensioning of the magnetizations of these two layers (depending on the thickness and/or choice of materials) must make it possible to cancel or drastically reduce the effective field that acts on the storage layer. The magnetic moments of these two layers must be similar to each other, with a slightly larger moment for the polarizing layer in order to compensate for the fact that it is farther away from the storage layer.

Also, in order to minimize radiation from the storage layer onto the reference layer, the magnetic moment of the storage layer must be significantly less than that of the polarizing and reference layers. It is possible to reduce the magnetic moment of the storage layer by reducing the thickness of this layer and/or using a weakly magnetic material or even producing a storage layer with a synthetic ferrimagnetic structure. This structure can be obtained by two ferromagnetic layers (FM) separated by a Ru, FM/Ru/FM spacer having a typical thickness of 0.5 nm to 1 nm.

The antiferromagnetic coupling caused by the Ru reduces the effective magnetization ($M_{eff}$) of the structure by the difference in magnetization between the two layers FM. This moment cannot, however, be reduced to zero because the torque exerted by the magnetic write field is also reduced by decreasing the effective moment and this makes writing difficult or even impossible. Preferably, the effective moment is equivalent to a 1-1.5 nm thick layer in order to obtain a weak coercive field and a reduced moment with FM electrodes with thicknesses greater than 2 nm.

The advantage of this double tunnel-junction structure is that it allows more effective heating of the storage tri-layer. This is due firstly to the fact that the heating power is one to two times greater than for a single barrier and secondly, since the structure is essentially symmetrical relative to the storage layer, maximum temperature is obtained at the level of the antiferromagnetic layer in the heart of the storage layer whereas in the structure in the first embodiment described, maximum temperature is obtained at the point immediately in contact with the tunnel barrier. It is preferable for the maximum temperature to occur in the antiferromagnetic layer because it is for the latter that the temperature must exceed the blocking temperature.

Summing up, this embodiment pertains to a dual structure, i.e. the storage layer is in the centre and inserted between two tunnel barriers each comprising a reference layer polarized by magnetostatic interaction with a polarizing layer separated from the reference layer by a thermal barrier.

3. Polarization by a Polarizing Layer Inserted in the Line which Ensures Electrical Connection to the Storage Cell In a third embodiment of the invention described more particularly in relation to FIG. 6a, the pinned polarizing layer is inserted above the tunnel junction into the conductor which ensures electrical connection to the top of the tunnel junction. Given the greater distance between this polarizing layer and the magnetic storage and reference layers of the tunnel junction compared with the preceding embodiments, flux closure is less satisfactory. Because of this, the field radiated by the polarizing layer acts on the magnetization of the reference layer and also acts significantly on the magnetization of the storage layer. The value of these radiated fields can be calculated by using finite element software such as FLUX3D [CEDRAT: www.cedrat.com]. This value depends on the magnetization of the material of the polarizing layer, its thickness, the width of the conductive line and the distance between said conductive line and the magnetic layers in question.

Figure 6A:
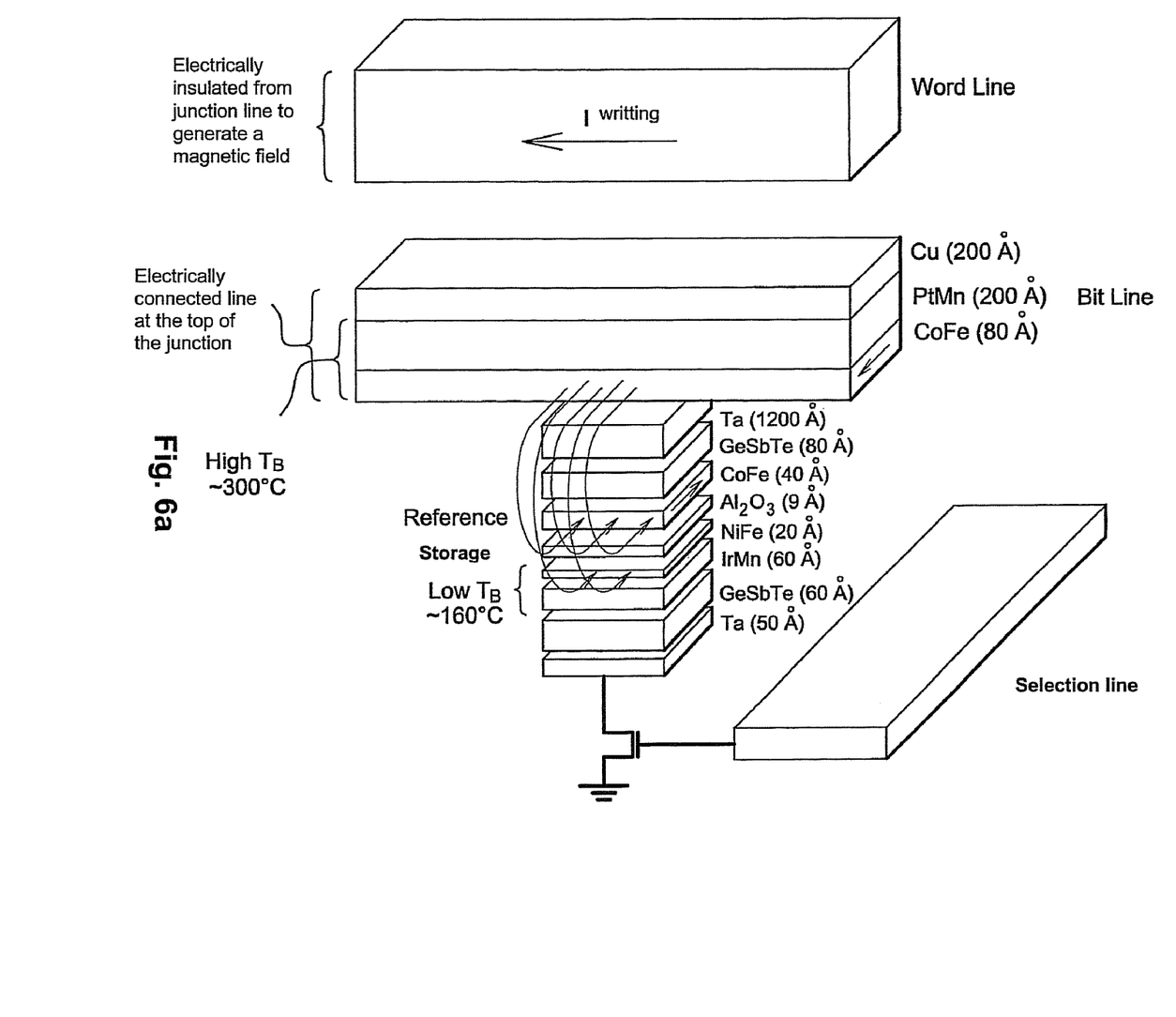
FIG. 6a is a schematic view of the structure of a storage cell in accordance with a third embodiment of the invention wherein the polarizing layer is integrated into one of the conductive lines (bit line) of said storage cell and FIG. 6b shows the underlying operating principle of this particular structure in an alternative embodiment.

The direction of the magnetization of the polarizing layer is advantageously oriented perpendicular to the length of the current line.

As shown in FIG. 6a, the conductive line can consist of this pinned polarizing layer (typical thickness: 4 to 15 nm), a pinning antiferromagnetic layer and be supplemented by a conductive copper layer which makes it possible to adjust the resistance of the line per unit of length to the desired value in order to supply the current density required for heating purposes to the junction. Because of the amplitude of the radiated fields, it is preferable for the polarizing layer to be located among the various layers that constitute the conductive line and as close as possible to the tunnel junction.

The existence of a significant field radiated by the polarizing layer onto the storage layer can be used advantageously: If one wants to switch the magnetization of the storage layer parallel to the direction of the field radiated by the polarizing layer at the level of the storage layer, it is sufficient to pass a heating current through the junction without any need to pass a write current in the bit line in order to generate a magnetic field. The magnetic field radiated by the polarizing layer is sufficient in itself to orientate the magnetization of the storage layer in the desired direction. On the other hand, in order to switch the magnetization in a direction opposite to the magnetic field radiated by the polarizing layer at the level of the storage layer, it is necessary to pass, in the bit line, a write current malting it possible to generate, at the level of the storage layer, a magnetic field of opposite direction to the magnetic field radiated by the polarizing layer and having an amplitude approximately twice as high, so that the sum of the two fields is roughly the opposite of the field radiated by the polarizing layer. This has the advantage that the current pulses required for a write are always in the same direction (single-pole current supply) and also the fact that these pulses are only required for writing one type of bit ("0" or "1"). The disadvantage is that the current intensity must be greater than if the polarizing layer were not radiating any field at the level of the storage layer.

For example, if the effective field (resulting from the vector sum of the fields radiated by the polarizing layer and the reference layer which have opposite directions) at the level of the storage layer is of the order of 30 Oe, the pulses to be supplied will have to create a 60 Oe field at the level of the storage layer rather than a ±30 Oe field if there were no field radiated by the polarizing layer at the level of the storage layer. Since the current is doubled, the required power is multiplied by 4. Also, for a given line width, because the required current density is doubled, this approach is more likely to experience electromigration problems in the word line.

The embodiment described assumes that the word line is parallel to the bit line. This makes it necessary to produce as many magnetic write fields as the number of "1" bits that are to be written and this is extremely power consuming.

Figure 6B:
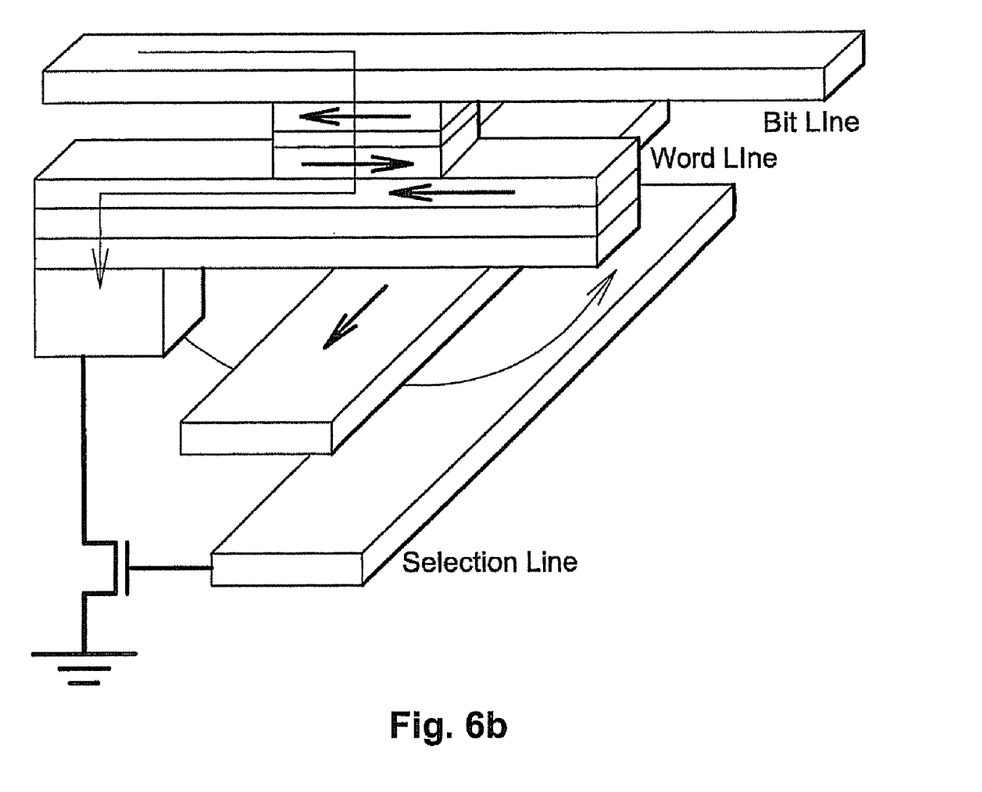

To restore more acceptable power consumption, it is preferable to integrate the polarizing layer into the lower part of the junction, i.e. that which connects the storage cell to the via, as shown in FIG. 6b. This reinstates perpendicularity of the bit lines and word lines.

It is also apparent, firstly, that the lower line which contains the polarizing layer is not the same length as the upper electrical contact line. Secondly, the (left and right) ends of the polarizing element can thus be moved closer to the storage cell in order to increase the polarizing field.

4. Polarization by Permanent Magnets Positioned Either Side of the Cell or Storage Cell In a fourth embodiment of the invention described more particularly in relation to FIGS. 8a, 8b, 9a and 9b, two lateral permanent magnets placed on both sides of the reference layer along the easy magnetization axis radiate the polarizing field. The magnetic field generated by these two magnets polarizes the magnetization direction of the reference layer. Their position along the z axis is preferably located at the same level as that of the reference layer so that the stabilizing field assumes its maximum value at the level of said layer.

Figure 8A:
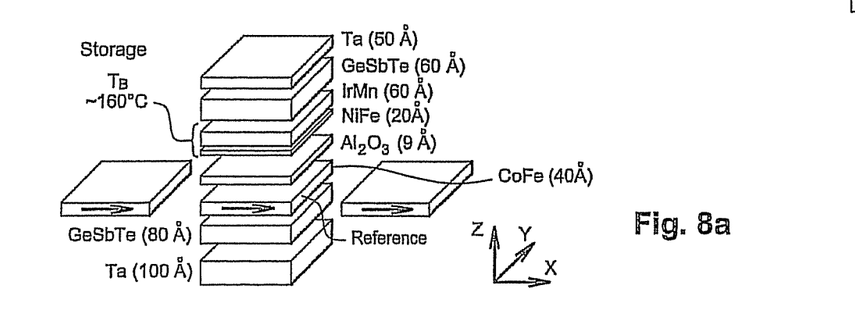
FIG. 8a is a schematic view of the structure of a storage cell in accordance with a fifth embodiment of the invention that uses permanent magnets and FIG. 8b shows their spatial arrangement.

The polarizing field is generated by permanent magnets that are placed away from storage cells. In this embodiment, the storage cells are immersed in the polarizing field radiated by permanent magnets capable of being separated from a chip that integrates a plurality of storage cells.

To make sure that the polarizing field is uniform over the entire surface area of the chip, the storage cells are centered and not in direct contact or close to the lateral surfaces of the permanent magnets placed either side of the chip. The profile of the field radiated by the permanent magnets can be calculated by using finite element software. The positioning of the memory chip is chosen, depending on the field profile, in a region where the magnetic field is sufficiently homogeneous. The magnets are placed so that the polarizing field is generated in the easy magnetization direction of the reference layer. This approach makes it possible to integrate the permanent magnets after fabrication of the storage cell array.

Figure 8B:
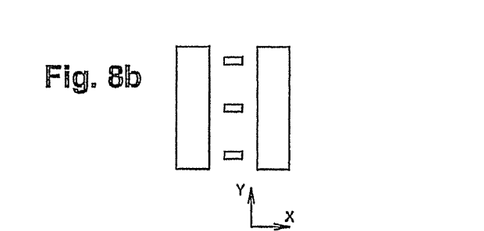

In FIG. 8b, one can see that the permanent magnets form lines that encompass more than one storage cell in order to minimize variations in the stabilizing field along the y axis and to make their fabrication easier.

The materials used to make these stabilizing magnets are layers of strongly magnetic ferromagnetic materials with a high coercive field such as SmCo, CoPt, CoCrPt or FePt.

In another embodiment, they can also consist of a layer made of a strongly magnetic ferromagnetic material, for example a CoFe alloy pinned by an antiferromagnetic layer with a high blocking temperature (>200° C.). This alternative embodiment has the advantage of requiring the same materials as those already used in the fabrication of the storage cell.

In both cases, the thickness of the polarizing ferromagnetic layer is adjusted depending on the polarizing field required and the magnetization of the material used.

As in the preceding embodiment, the field radiated at the level of the storage layer can be non-zero, thus making it possible to write the storage cell with unipolar current.

The dimensioning of the total magnetization of the reference layer (by altering its thickness or material) makes it possible to cancel or reduce the effective field that acts on the storage layer. The direction of the polarizing field is in opposition to the field radiated at the level of the storage layer.

Also, in order to minimize radiation from the storage layer onto the reference layer, it is possible to reduce the total magnetic moment of the storage layer by reducing the thickness of this layer and/or using a weakly magnetic material or even producing a storage layer with a synthetic ferrimagnetic structure.

Figure 9A:
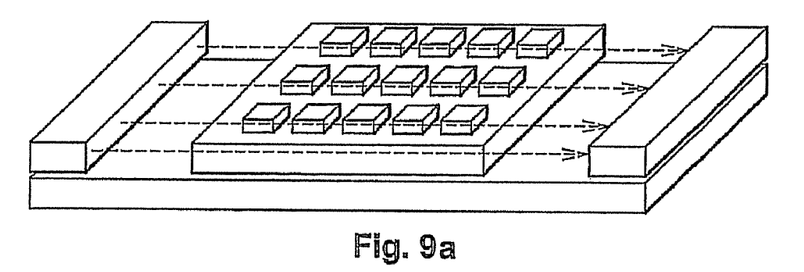
FIG. 9a is a schematic view of the structure of a storage cell in accordance with the previous embodiment that also uses permanent magnets and FIG. 9b shows the radiated magnetic fields.
Figure 9B:
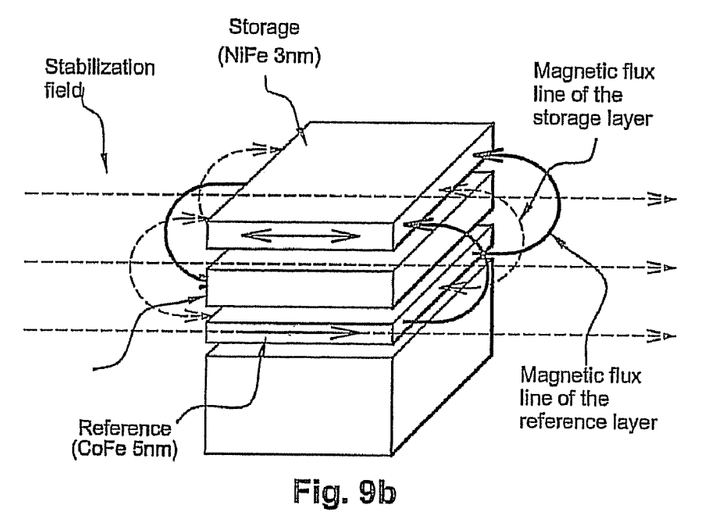

FIG. 9b shows the radiated and polarizing fields. One can see that, at the level of the storage layer, the stabilizing field and the field radiated by the reference layer are in opposition. The field radiated by the storage layer can stabilize (or destabilize) the direction of the reference layer depending whether its direction is anti-parallel (or parallel) to that of the storage layer.

5. Polarization by a Permanent Polarizing Magnet above the Chip

Figure 10:
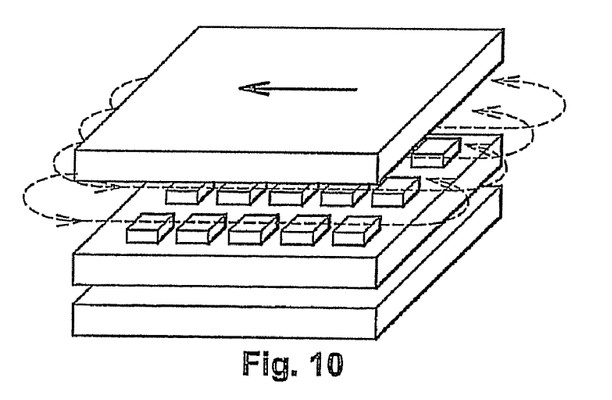
FIG. 10 is a schematic view of the structure of a storage cell in accordance with a sixth embodiment of the invention wherein the permanent magnet is located above the storage cell.

In another embodiment shown in FIG. 10, the polarizing field is once again generated by a permanent magnet placed away from the storage cells but located above the chip.

This permanent magnet is a layer with a high magnetic moment and high coercivity and covers the entire surface of the chip.

It is the field lines that loop between the North pole and South pole of the magnet that generate the polarizing field on the chip.

This configuration has the advantage of reducing overall dimensions. By positioning the permanent magnet above the chip, it does not take up extra space.

Once again, dimensioning of the storage and reference layers and the polarizing field is dictated by the following objectives:

reduce or cancel the effective field (the result of the vector sum of the field radiated by the reference layer, the polarizing field created by the permanent magnet and any orange-peel coupling between the storage layer and the reference layer) at the level of the storage layer by compensating the magnetostatic field radiated by the reference layer by the polarizing field created by the permanent magnet;

create a polarizing field due to the permanent magnet at the level of the upper reference layer higher in modulus than the field radiated by the storage layer at the level of the reference layer—the difference between these two fields must be sufficiently large to allow the magnetization of the reference layer to be maintained parallel to the polarizing field, regardless of the orientation of the magnetization of the storage layer.

the magnetic field generated by the write line can also be used to accentuate alignment of the reference layer in the desired direction. This implies that, when a word is written, the storage cells along a field line are written in a first direction and during a second stage with a field that stabilizes the desired direction opposite the initial field for the reference layer.

6. Storage Cell with Laminated Reference Layer

Figure 11:
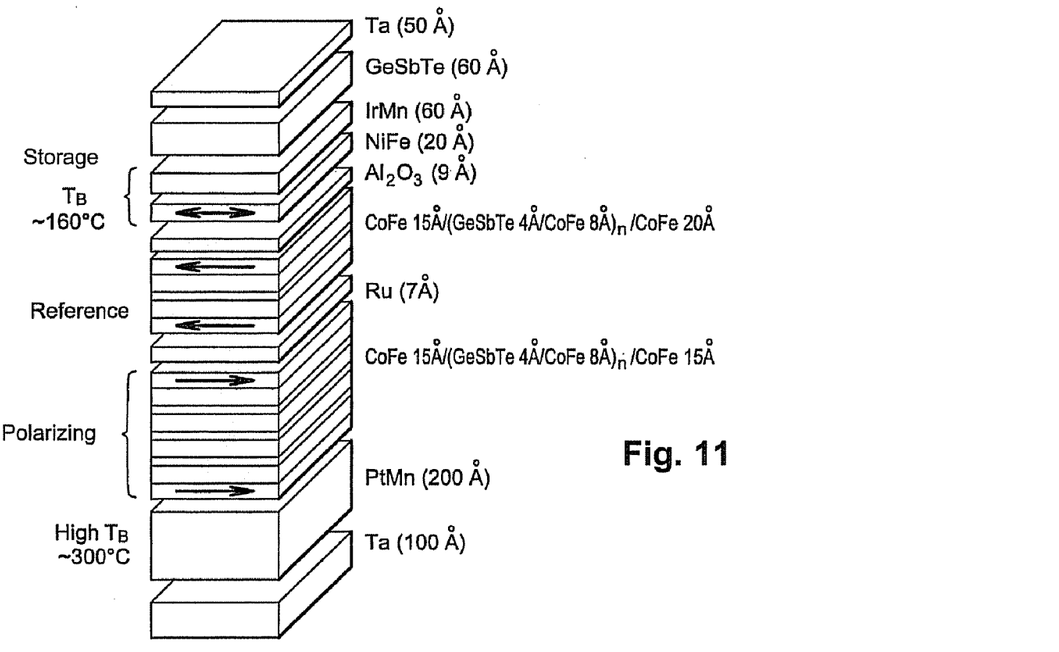
FIG. 11 is a schematic view of the structure of a storage cell in accordance with a seventh embodiment of the invention wherein the reference layer is in laminated form.

In a sixth embodiment of the invention shown in FIG. 11, the stack consists of a structure with a single tunnel junction but with the difference that, unlike the structure described in FIG. 2, it uses laminated reference and polarizing layers.

The general idea of lamination is to create many interfaces inside the reference and polarizing layers in order to diminish their thermal conductivity. In fact, from an electrical point of view, it is known that, for example, a Co/Ru interface has the same electrical resistance as a 20 nm thick layer of Co. The same applies to thermal resistance. Because the atoms across an interface, generally speaking, are less solidly linked than that in a homogeneous material and because the interfaces often constitute discontinuities in electronic structures, interfaces have electrical and thermal resistances typically equivalent to several nanometers of homogeneous materials. Thus, by multiplying the number of interfaces inside the reference and polarizing layers, one can thus reduce their thermal conductivity. In a way, the interfaces act as a thermal barrier.

This lamination can be obtained in one or other of the following ways or a combination of both ways.

The first way of laminating the reference and polarizing layers consists in replacing these simple layers, for example 2.5 nm CoFe, by multilayers consisting of several ferromagnetic layers typically having a thickness of the order of 1.5 nm to 3 nm and anti-parallel coupled to each other by an appropriate spacer, for example one made of ruthenium and typically having a thickness of 0.5 nm to 0.9 nm. This way one can provide three, four or even more ferromagnetic layers which are anti-parallel coupled to each other with the layer which is farthest away from the tunnel barrier being pinned by exchange interaction with an antiferromagnetic pinning layer made of PtMn for example.

Also, the ferromagnetic layer which is in direct contact with the tunnel barrier may be slightly thicker than the layers which are deeper inside the multilayer in order to maximize the amplitude of the magnetoresistance of the tunnel junction. One can, for instance, select a thickness for the last layer which is in contact with the tunnel barrier of the order of 2.5 nm whereas the ferromagnetic layers deeper inside the laminated stack between the tunnel barrier and the antiferromagnetic pinning layer can have a thickness of 1.5 nm.

The advantage of this approach is the possibility of pinning the polarizing layer by an antiferromagnetic material which will not be exposed to large temperature variations because it is separated from the tunnel barrier by a whole stack of layers with a reduced thermal connectivity.

The second way of obtaining lamination is to introduce extremely thin layers of materials with a low thermal conductivity into the reference and polarizing layers.

In this case, the laminated layers are formed by inserting thin layers of a second material with a low thermal conductivity, for example GeSbTe, into a first magnetic material, for example CoFe. It is also possible to insert a material of average thermal conductivity (for instance Ta) but whose interfaces with the magnetic material have a low thermal conductivity.

The purpose of this lamination of the CoFe by inserting thin layers, for example layers of GeSbTe or Ta, is to lower the effective thermal conductivity of the stack whilst preserving sufficient magnetic cohesion. The GeSbTe or Ta layers must be sufficiently thin for the CoFe layers to remain tightly ferromagnetically coupled to each other (typically less than 1.5 nm) but sufficiently to reduce the thermal conductivity significantly (typically less than 0.6 nm given that it is firstly the total thickness of GeSbTe or Ta that counts and secondly the number of interfaces and hence the number of layers inserted). If the interfaces between the magnetic metal and the inserted layers have a low thermal conductivity, it is obvious that it is then useful to increase the number of these interfaces by inserting a large number of lamination layers. Increasing the number of interfaces thus helps reduce the effective thermal conductivity of the laminated layer and acts as a thermal barrier.

Lamination using a material with a low thermal conductivity (GeSeTe or Ta) reduces the total thermal conductivity of the laminated reference and polarizing layers. This makes it possible to improve the confinement of heat in the storage layer between the first thermal barrier (6 nm of GeSbTe) and the laminated reference electrode. It also makes it possible to reduce the temperature rise in the PtMn antiferromagnetic layer which pins the polarizing layer with which the reference layer is coupled. The objective here is to allow a wider operating temperature range for obtaining writing to the storage layer without losing the magnetization direction of the reference electrode thus produced.

Moreover, the two lamination approaches suggested above can be combined, i.e. one can produce reference and polarizing layers consisting of a number of layers having a ferromagnetic behavior but antiferromagnetically coupled to each other through an appropriate spacer (for instance a 0.6 nm thick Ru spacer), with each of the layers exhibiting ferromagnetic behavior itself consisting of a laminated stack of ferromagnetic layers (for example CoFe separated by ultra thin layers of materials with a low thermal conductivity (for example Ta or GeSbTe).

Generally speaking, increasing the number of repetitions makes it possible to reduce, further still, the thermal conductance of the entire stack between the tunnel barrier and the antiferromagnetic layer that pins the reference layer. Nevertheless, the quality with which the reference layer is pinned deteriorates as the number of repetitions increases and a compromise must therefore be struck between reducing the thermal conductivity and adequate pinning. In this embodiment, all the layers which constitute the reference and polarizing layers and exhibit ferromagnetic behavior are not necessarily laminated in the same way. In particular, it is possible not to laminate the last ferromagnetic layer which is in contact with the tunnel barrier in order to avoid this lamination affecting the polarization of electrons whilst laminating the deeper layers with ferromagnetic behavior, i.e. those that are farther away from the tunnel barrier.

Advantageously, in each of the laminated stacks, the layers that are in contact with either the tunnel barrier or the Ru layers or the layer of antiferromagnetic material can be thicker than the CoFe layers inside stacks (typically about 1.5 nm rather than 0.8 to 1 nm) in order to boost tunnel magnetoresistance amplitude or antiferromagnetic coupling through the Ru or ferromagnetic/antiferromagnetic exchange anisotropy coupling respectively.

The last constituent layer of the reference layer which is in contact with the tunnel barrier can also be made of a ferromagnetic material other than CoFe if this is necessary in order to grow the tunnel barrier, as in the case of an MgO barrier which is normally prepared on a CoFeB layer.

In the example described (FIG. 11), the thicknesses of the laminated CoFe 8 Å and GeSbTe 4 Å layers are chosen so as to maintain direct ferromagnetic coupling between the first and last laminated CoFe layer. This lamination is repeated n times in order to ensure thermal insulation of the PtMn layer.

Obviously, the use of such laminated reference layers can also be envisaged in the context of dual structures of the type described in relation to FIG. 5 which use two tunnel barriers with a central storage layer. In this configuration, it is the two CoFe/GeSbTe/CoFe/PtMn stacks in FIG. 5 that are replaced by laminated layers (CoFe/GeSbTe)/CoFe/Ru/CoFe (GeSbTe/CoFe)/PtMn.

7. Spin-Transfer Write

In the context of the method of operation described earlier, the storage cell is written by applying a magnetic field generated by passing an electric current in a current line located close to the storage cell, generally speaking above the latter, as shown in FIG. 2 for instance. This field is applied when the blocking temperature of the antiferromagnetic layer that pins the ferromagnetic storage layer is exceeded and during cooling of the storage cell, this cooling being caused by switching off the heating current that flows through the tunnel junction. The new magnetization direction of the storage layer is determined by the direction of this applied field generated by the current line and which is maintained during cooling of the junction.

With an alternative write mode, it is possible to use the spin polarization of the current flowing through the junction in order to act directly on the magnetization direction of the storage layer. This write mode which is known as spin transfer, exploits the fact that electrons originating from the reference layer that penetrate into the storage layer are spin polarized. Having crossed the barrier that separates the two ferromagnetic electrodes of the junction, the spins of the electrons penetrating the storage layer are re-orientated depending on the magnetization direction of the storage layer by exerting a torque on its magnetization which, for current densities of the order of $10^5$-$10^7$ A/cm$^2$, is sufficiently strong to reverse the magnetization of the storage layer. Writing is then determined by the direction of the current that is sent. If the electrons move from the reference layer to the storage layer, the spin-polarized current favors a parallel configuration of the storage and reference layers (low-resistance state). When the electrons flow in the opposite direction, an anti-parallel configuration (high-resistance state) is favored. The critical current for reversing the storage layer is not necessarily symmetrical because of the magnetostatic fields that are present and the intrinsic unbalance of the spin transfer phenomenon.

This write mode can also be performed in a cell with a storage layer consisting of a ferromagnetic electrode (NiFe, CoFeB, CoFe 1-4 nm) pinned by an antiferromagnetic layer (IrMn 6 nm) with a low blocking temperature (160° C.). The reference layer can be produced using the six methods described above. For example, the reference layer may consist of a laminated ferromagnetic layer which is antiferromagnetically coupled to a polarizing layer which is pinned by an antiferromagnetic layer (PtMn, IrMn, NiMn 10-25 nm) with a high blocking temperature (>250° C.) (PtMn in FIG. 12). The second laminated layer (reference layer) is polarized by antiferromagnetic coupling through a spacer made of ruthenium having a typical thickness of 0.5 nm to 1 nm.

This operating method is described, for example, in Document EP 1 466 329. With the write mode that uses spin-polarized current, the critical current for reversing the storage layer must be less than the current required to achieve an increase in the temperature of the antiferromagnetic layer which pins the storage layer beyond its blocking temperature.

Thus, magnetization of the storage layer in one direction or another depending on the direction of the current flowing through the tunnel junction is re-orientated as soon as this blocking temperature is exceeded.

Polarization of the reference layer can be obtained using the methods described above in relation to the first six embodiments.

Figure 12:
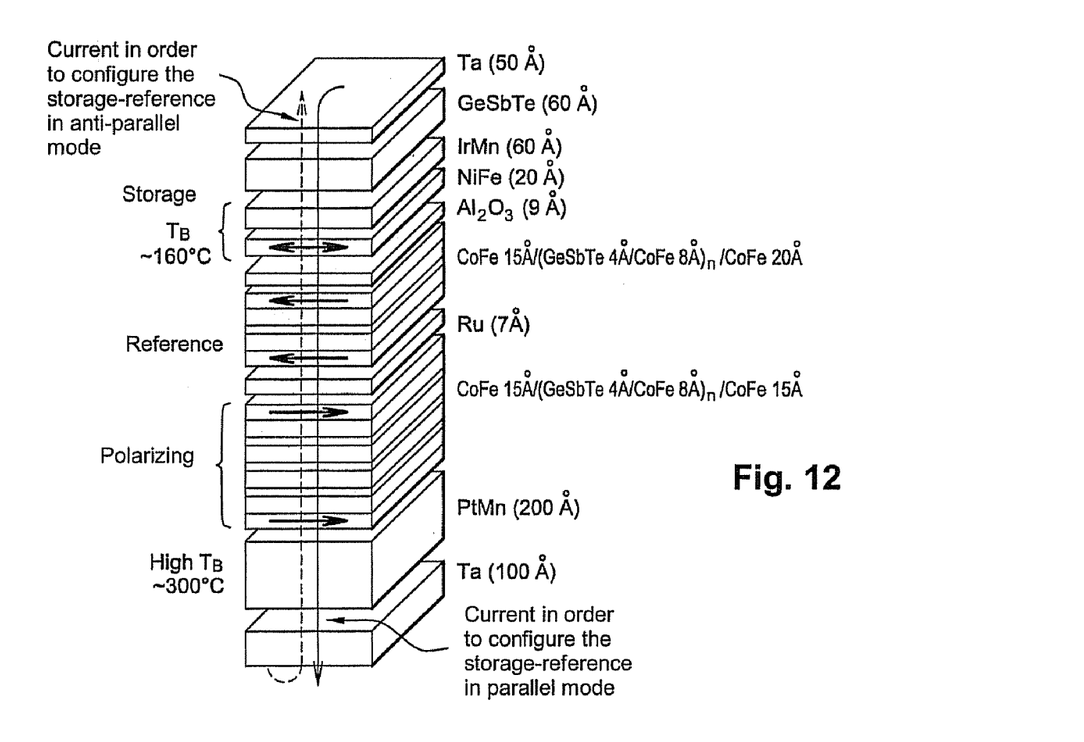
FIG. 12 is a schematic view of using a spin-polarized current and polarization of the reference layer as described in the embodiment in FIG. 11 to write a storage cell.

FIG. 12 shows performing a storage cell write operation with spin-polarized current and polarization of the reference layer as described for the last embodiment described (Section 6). The tunnel barrier that separates the two electrodes must be thin in order to allow a considerable flow of electrons due to the tunnel effect. The characteristic RA product of these barriers must be 1 to 100 $\Omega \cdot \mu^2$ inclusive in order to allow high current densities (>$10^5$ A/cm$^2$) at voltages below the breakdown voltage of the junction.

These barriers can be made of $Al_2O_3$, $TiO_2$ or MgO with typical thicknesses of 0.5 to 2 nm. The reference layer-tunnel barrier-storage layer assembly is placed between two thermal barriers in order to improve heating effectiveness and confine heat to the junction.

The polarizing and antiferromagnetic reference layers are laminated with a material of low thermal conductivity (for example GeSbTe). The reference layer is polarized by a pinned polarizing layer. The antiferromagnetic pinning layer (PtMn) is located outside the area delimited by the thermal barriers. This embodiment simplifies the architecture of the memory because it does not require an additional current line in order to generate a magnetic field.

In FIG. 12, the write current in order to configure the storage and reference layers in anti-parallel mode is shown by a substantially vertical upward arrow (dashed line) and the direction of the write current in order to configure the storage and reference layers in parallel mode is shown by a substantially vertical downward arrow (solid line).

The invention claimed is:

1. A magnetic memory with a thermally-assisted write, every storage cell of which consists of at least one magnetic tunnel junction, said tunnel junction comprising at least:
one magnetic reference layer, the magnetization of which is always oriented in the same direction at the time of the read of the storage cell;
one so-called "free" magnetic storage layer, the magnetization direction of which is variable;
one insulating layer sandwiched between the reference layer and the storage layer,
wherein the magnetization direction of the reference layer is polarized in a direction that is substantially always the same at the time of a read due to magnetostatic interaction with another fixed-magnetization layer called the "polarizing layer" and in that the polarizing layer is arranged so that it is subjected, during read phases and write phases, to thermal variations that are less than those to which the reference layer with which it interacts magnetostatically is subjected.

2. A magnetic memory with a thermally-assisted write as claimed in claim 1, wherein a layer of low thermal conductivity is placed between the reference layer and the polarizing layer in order to limit the thermal variations of the polarizing layer during read and write phases.

3. A magnetic memory with a thermally-assisted write as claimed in claim 2, wherein the layer of low thermal conductivity placed between the reference layer and the polarizing layer is made of GeSbTe or BiTe.

4. A magnetic memory with a thermally-assisted write as claimed in claim 1, wherein the storage layer comprises a bilayer that associates firstly a layer of a ferromagnetic material, typically selected from the group comprising Permalloy ($Ni_{80}Fe_{20}$) and $Co_{90}Fe_{10}$ and secondly an antiferromagnetic layer having a moderate blocking temperature.

5. A magnetic memory with a thermally-assisted write as claimed in claim 4, wherein the bilayer of the storage layer has planar magnetization.

6. A magnetic memory with a thermally-assisted write as claimed in claim 4, wherein the antiferromagnetic layer having a moderate blocking temperature consists of an IrMn alloy having a composition close to $Ir_{20}Mn_{80}$.

7. A magnetic memory with a thermally-assisted write as claimed in claim 4, wherein the selected respective thickness of the layers made of a ferromagnetic and antiferromagnetic material constituting the storage layer is 1 to 4 nm for the former and 4 to 8 nm for the latter.

8. A magnetic memory with a thermally-assisted write as claimed in claim 1, wherein the polarizing layer comprises a bilayer which associates firstly a layer of a ferromagnetic material, typically a $Co_{1-x}Fe_x$ alloy, x being 0 to 0.50, and secondly an antiferromagnetic layer having a high blocking temperature.

9. A magnetic memory with a thermally-assisted write as claimed in claim 8, wherein the antiferromagnetic layer that fixes the magnetization direction of the polarizing layer is made of PtMn or IrMn.

10. A magnetic memory with a thermally-assisted write as claimed in claim 1, wherein if a magnetic field is used for writing, it is used to accentuate the magnetization orientation of the reference layer.

11. A magnetic memory with a thermally-assisted write as claimed in claim 1, wherein the ferromagnetic polarizing layer is made of a material with high coercivity made from a material selected from the group comprising $Co_{80}Cr_{20}$ and SmCo.

12. A magnetic memory with a thermally-assisted write as claimed in claim 1, wherein the polarizing layer is inserted in the line which ensures electrical connection to the storage cell and in that its magnetization direction is substantially perpendicular to the length of the line.

13. A magnetic memory with a thermally-assisted write as claimed in claim 12, wherein the conductive line consists of the polarizing layer, an antiferromagnetic pinning layer and is supplemented by a non-magnetic conductive layer, said polarizing and antiferromagnetic pinning layers being of the same kind as that in claim 9 or 11.

14. A magnetic memory with a thermally-assisted write as claimed in claim 1, wherein the reference layer is made of a ferromagnetic material selected from the group comprising an alloy of CoFe ($Co_{90}Fe_{10}$, $Co_{70}Fe_{30}$, $Co_{80}Fe_{10}B_{10}$), of NiFe ($Ni_{80}Fe_{20}$) or a 1 nm CoFe/2 nm NiFe bilayer.

15. A magnetic memory with a thermally-assisted write as claimed in claim 14, wherein the thickness of the reference layer is 1 to 4 nm.

16. A magnetic memory with a thermally-assisted write as claimed in claim 4, wherein the side of the storage layer opposite the tunnel barrier is in contact with a layer of very low thermal conductivity used as a thermal barrier.

17. A magnetic memory with a thermally-assisted write as claimed in claim 16, wherein the layer acting as a thermal barrier is made of a material selected from the group comprising BiTe and GeSbTe having a thickness of 2 to 10 nm.

18. A magnetic memory with a thermally-assisted write as claimed in claim 5, wherein every storage cell consists of a double magnetic tunnel junction having a single storage layer in common, said storage layer being inserted between the two tunnel barriers, each tunnel barrier having, on the side opposite the storage layer, a reference layer, the magnetization of which is maintained in a fixed direction at the time of a read by magnetostatic interaction with a pinned magnetization polarizing layer, the two reference layers being separated from the two polarizing layers with which they are respectively magnetostatically coupled by a thermal barrier.

19. A magnetic memory with a thermally-assisted write as claimed in claim 18, wherein the storage layer consists of a tri-layer comprising a central antiferromagnetic layer with a moderate blocking temperature made of a material selected from the group comprising IrMn, PtMn and PtPdMn sandwiched between two ferromagnetic layers of soft materials in contact with the tunnel barriers, said ferromagnetic layers being made of $Ni_{80}Fe_{20}$, $Co_{100-x}Fe_x$ where x is typically 0 to 30, $Co_{100-x-y}Fe_xB_y$, where x is typically 0 to 30 and y is typically 0 to 20.

20. A magnetic memory with a thermally-assisted write as claimed in claim 1, wherein the polarizing layer consists of permanent magnets placed either side of the storage cell.

21. A magnetic memory with a thermally-assisted write as claimed in claim 20, wherein the permanent magnets are placed at the level of the reference layer.

22. A magnetic memory with a thermally-assisted write as claimed in claim 20, wherein the permanent magnets consist of layers of strongly magnetic ferromagnetic materials with high coercive fields selected from the group comprising SmCo, CoPt, CoCrPt and FePt.

23. A magnetic memory with a thermally-assisted write as claimed in claim 20, wherein the permanent magnets consist of strongly magnetic ferromagnetic materials, particularly those based on a CoFe alloy and pinned by an antiferromagnetic layer with a high blocking temperature in excess of 200° C. in particular.

24. A magnetic memory with a thermally-assisted write as claimed in claim 1, wherein the polarizing layer that interacts magnetostatically with the reference layer consists of a permanent magnet located above the memory.

25. A magnetic memory with a thermally-assisted write as claimed in claim 1, wherein the reference layer consists of a number of ferromagnetic layers which are antiferromagnetically coupled through a non-magnetic spacer, especially one made of ruthenium.

26. A magnetic memory with a thermally-assisted write as claimed in claim 1, wherein the polarizing layer consists of a number of ferromagnetic layers which are antiferromagnetically coupled through a non-magnetic spacer, especially one made of ruthenium.

27. A magnetic memory with a thermally-assisted write as claimed in claim 1, wherein the reference layer is laminated and produced by inserting, into a first magnetic material, especially CoFe, thin layers of a second material with a low thermal conductivity, especially GeSbTe or Ta.

28. A magnetic memory with a thermally-assisted write as claimed in claim 1, wherein the polarizing layer is laminated and produced by inserting, into a first magnetic material, especially CoFe, thin layers of a second material with a low thermal conductivity, especially GeSbTe or Ta.

29. A magnetic memory as claimed in claim 25, wherein at least one of the ferromagnetic layers which are antiferromagnetically coupled and which constitute the reference layer is itself laminated and produced by inserting into this ferromagnetic layer, thin layers of a second material with a low thermal conductivity, especially GeSbTe or Ta.

30. A magnetic memory as claimed in claim 26, wherein at least one of the ferromagnetic layers which are antiferromagnetically coupled and which constitute the polarizing layer is itself laminated and produced by inserting into this ferromagnetic layer, thin layers of a second material with a low thermal conductivity, especially GeSbTe or Ta.

31. A magnetic memory with a thermally-assisted write as claimed in any of claims 26, 28 and 30, wherein the polarizing layer is pinned by an antiferromagnetic layer, especially one made of PtMn, with the laminated reference layer being polarized by said polarizing layer by antiferromagnetic coupling through a spacer made of ruthenium, this coupling being added to the magnetostatic coupling between these layers.

32. A magnetic memory with a thermally-assisted write as claimed in claim 1, wherein the reference layer is in contact with the tunnel barrier of the magnetic tunnel junction, with the last constituent layer of the reference layer which is in contact with said tunnel barrier being likely to be made of a ferromagnetic material selected from the group comprising CoFe and CoFeB.

33. A magnetic memory with a thermally-assisted write as claimed in claim 25, wherein the number of stacks coupled in anti-parallel by one ruthenium layer and consisting of the laminated reference layer/laminated polarizing layer assembly is greater than two, with the stack farthest from the tunnel barrier being pinned by interaction with a layer made of an antiferromagnetic material.

34. A magnetic memory with a thermally-assisted write as claimed in claim 33, wherein the ferromagnetic layers that are in immediate contact with the tunnel barrier of the magnetic tunnel junction and the ruthenium layer are thicker than those within the laminated layers.

* * * * *